(12) United States Patent
Shiobara et al.

(10) Patent No.: US 8,329,385 B2
(45) Date of Patent: Dec. 11, 2012

(54) METHOD OF MANUFACTURING A SEMICONDUCTOR DEVICE

(75) Inventors: Eishi Shiobara, Kanagawa (JP);
Keisuke Kikutani, Kanagawa (JP);
Kazuyuki Yahiro, Kanagawa (JP);
Kentaro Matsunaga, Kanagawa (JP);
Tomoya Oori, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 517 days.

(21) Appl. No.: 12/481,919

(22) Filed: Jun. 10, 2009

(65) Prior Publication Data

US 2009/0305166 A1 Dec. 10, 2009

(30) Foreign Application Priority Data

Jun. 10, 2008 (JP) .................................. 2008-152016
Feb. 27, 2009 (JP) .................................. 2009-046313

(51) Int. Cl.
*G03F 7/26* (2006.01)

(52) U.S. Cl. ...................................................... 430/314

(58) Field of Classification Search .................. 430/324, 430/317, 315, 314
See application file for complete search history.

(56) References Cited

U.S. PATENT DOCUMENTS

| 4,803,181 | A | 2/1989 | Buchmann et al. |
| 6,063,688 | A | 5/2000 | Doyle et al. |
| 6,226,074 | B1 | 5/2001 | Fujisawa et al. |
| 6,376,139 | B1 | 4/2002 | Fujisawa et al. |
| 2002/0001778 | A1* | 1/2002 | Latchford et al. ............ 430/313 |
| 2002/0037637 | A1* | 3/2002 | Xing et al. .................... 438/552 |
| 2002/0182521 | A1 | 12/2002 | Fujisawa et al. |
| 2004/0102048 | A1 | 5/2004 | Yamaguchi |
| 2006/0240359 | A1* | 10/2006 | Liu ............................... 430/313 |
| 2008/0122125 | A1* | 5/2008 | Zhou ............................. 257/797 |

FOREIGN PATENT DOCUMENTS

| JP | 3-270227 | 12/1991 |
| JP | 2000-310850 | 11/2000 |
| JP | 2001-102282 | 4/2001 |
| JP | 2002-25895 | 1/2002 |
| JP | 2002-299205 | 10/2002 |

* cited by examiner

*Primary Examiner* — Kathleen Duda
*Assistant Examiner* — Caleen Sullivan
(74) *Attorney, Agent, or Firm* — Finnegan, Henderson, Farabow, Garrett & Dunner, L.L.P.

(57) ABSTRACT

A method of manufacturing a semiconductor device according to one embodiment, includes: forming a first mask material film on a workpiece film formed on a semiconductor substrate; forming a resist pattern on the first mask material film; forming a second mask material film having a desired film thickness on the first mask material film so as to cover the resist pattern; carrying out etchback of the second mask material film so as to expose the resist pattern and the first mask material film; processing the resist pattern and the first mask material film simultaneously which are exposed, while leaving the second mask material film of which etchback is carried out; and processing the workpiece film which exposes under the first mask material film.

17 Claims, 12 Drawing Sheets

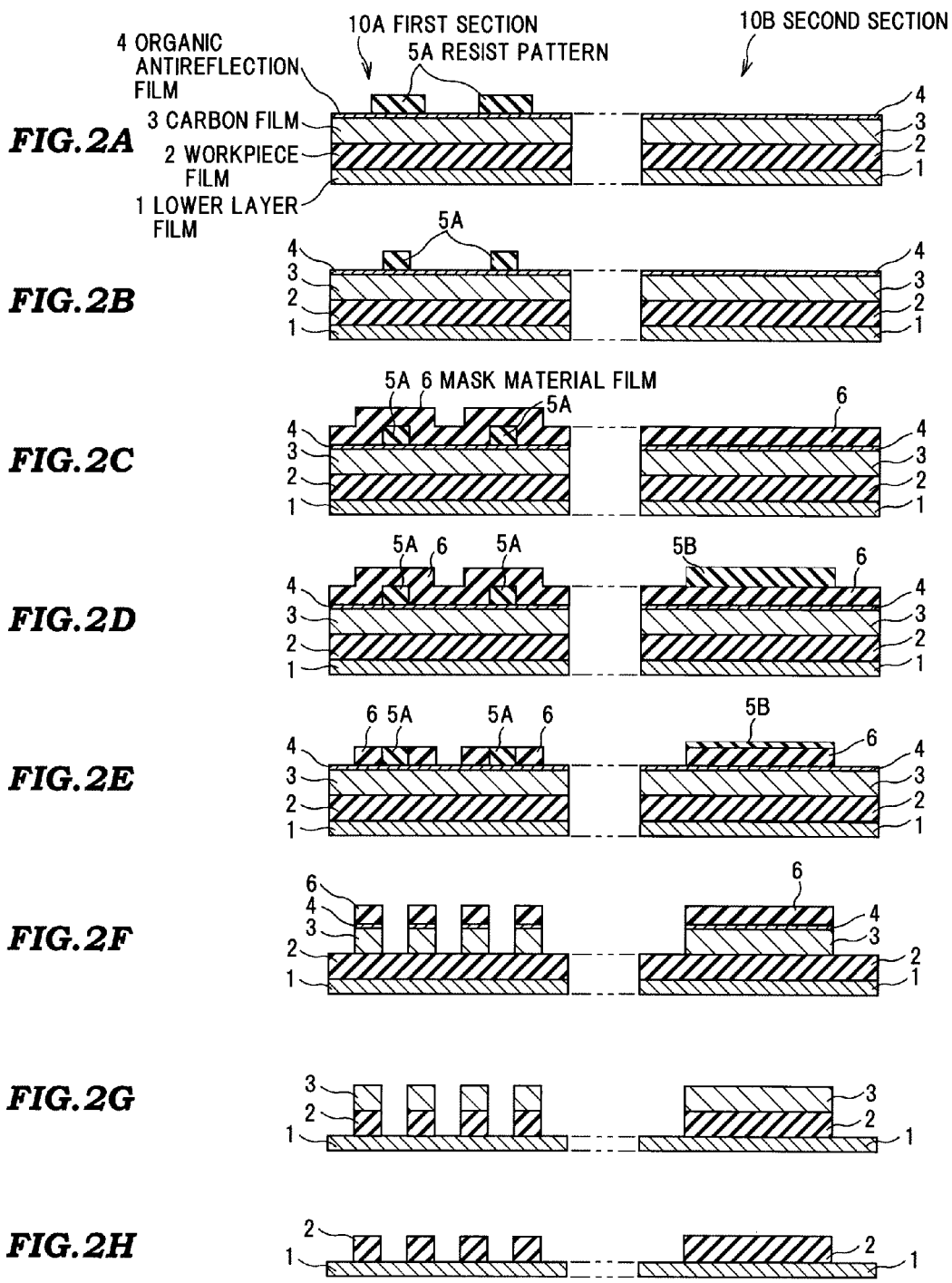

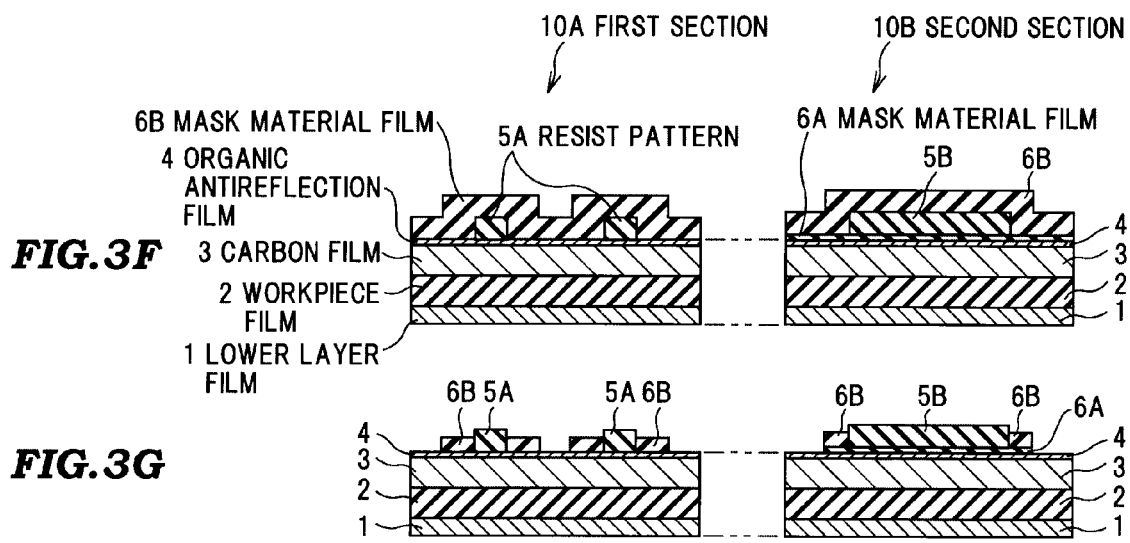
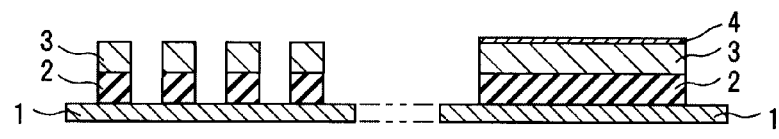
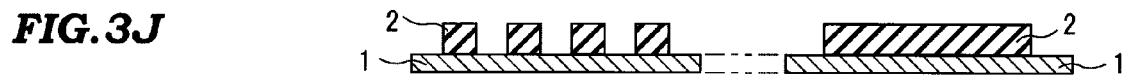

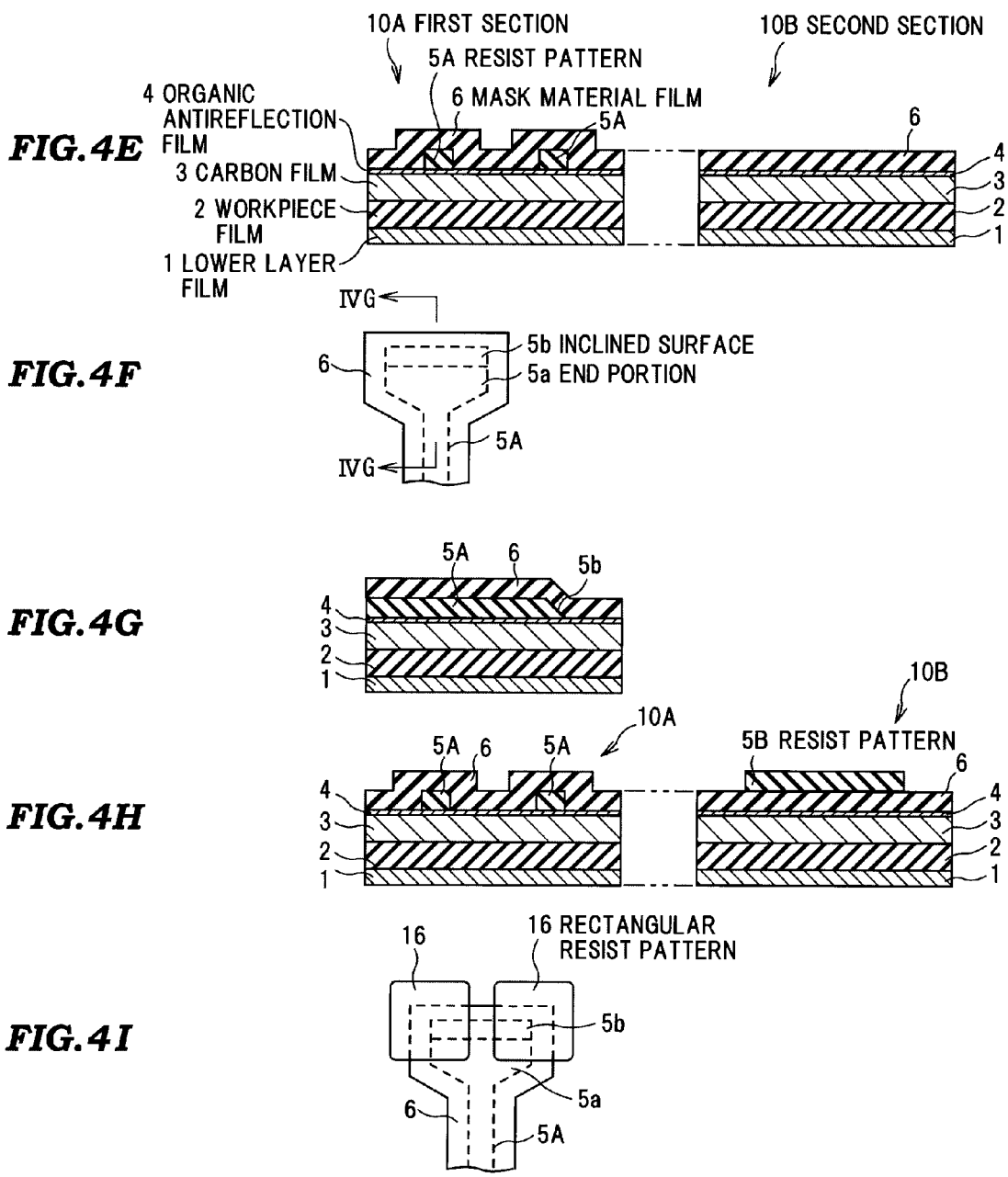

*FIG. 4J*
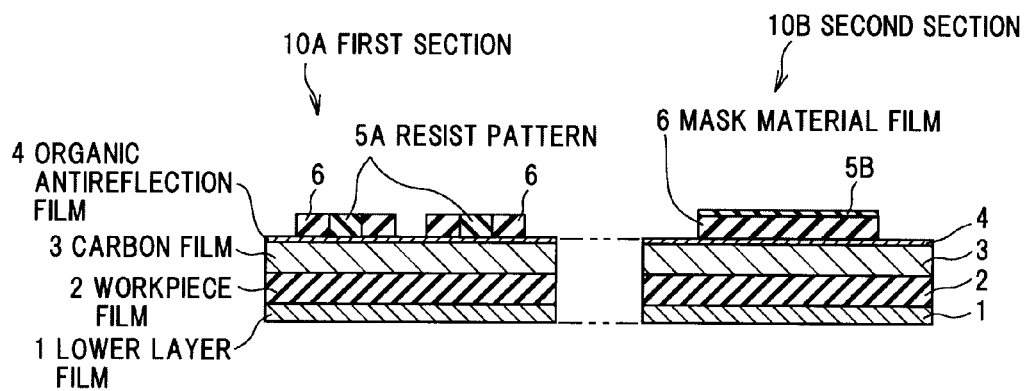
*FIG. 4K* *FIG. 4L*
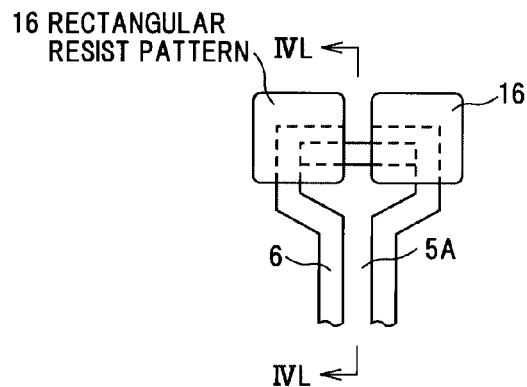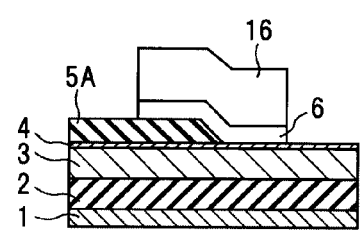
*FIG. 4M*
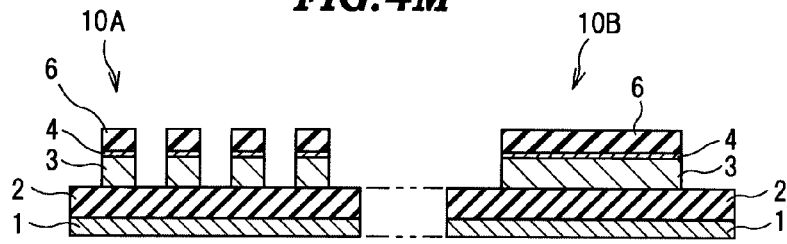
*FIG. 4N* *FIG. 4O*
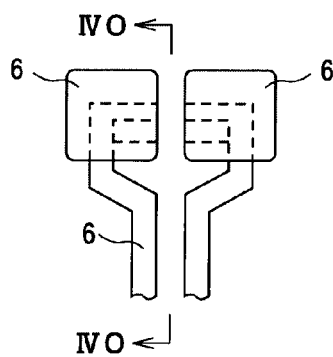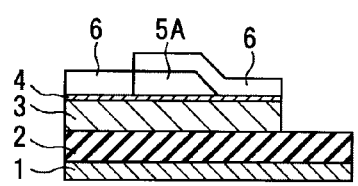

- 3 CARBON FILM
- 2 WORKPIECE FILM
- 1 LOWER LAYER FILM
- 10A FIRST SECTION
- 10B SECOND SECTION

METHOD OF MANUFACTURING A SEMICONDUCTOR DEVICE

CROSS-REFERENCE TO RELATED APPLICATIONS

This application is based upon and claims the benefit of priority from prior Japanese Patent Application No. 2008-152016, filed on Jun. 10, 2008, and No. 2009-46313, filed on Feb. 27, 2009, the entire contents of which are incorporated herein by reference.

BACKGROUND

Recently, in accordance with miniaturization of a semiconductor device, a method is needed, that is capable of forming a pattern having a dimension which exceeds an exposure resolution limit in lithography method.

As one example of the method, a method is known, that includes that sidewall patterns on side surfaces of a resist pattern (core material) are formed and a workpiece film which underlies is etched by using the sidewall patterns as a mask after the core material is eliminated. This method is, for example, disclosed in JP-A-1991(H03)-270227.

The above-mentioned conventional method includes that a bottom resist layer, an interlayer (spin on glass film), an upper layer resist pattern (core material) are formed in this order, and then a silicon nitride film (sidewall pattern) is formed in both of the sidewalls of the upper layer resist pattern, and the upper layer resist pattern is eliminated by development or ashing, and then the interlayer is etched by an etchant while using the silicon nitride film as a mask, and the bottom resist layer is anisotropically-etched by using oxygen plasma. Consequently, a microscopic pattern having a three-layer structure is formed, the three-layer structure including the bottom resist layer, the interlayer, and silicon nitride film.

BRIEF SUMMARY

A method of manufacturing a semiconductor device according to one embodiment, includes: forming a first mask material film on a workpiece film formed on a semiconductor substrate; forming a resist pattern on the first mask material film; forming a second mask material film having a desired film thickness on the first mask material film so as to cover the resist pattern; carrying out etchback of the second mask material film so as to expose the resist pattern and the first mask material film; processing the resist pattern and the first mask material film simultaneously which are exposed, while leaving the second mask material film of which etchback is carried out; and processing the workpiece film which exposes under the first mask material film.

A method of manufacturing a semiconductor device according to another embodiment, includes: forming a first mask material film on a workpiece film formed on a semiconductor substrate; forming a first resist pattern on the first mask material film; forming a second mask material film having a desired film thickness on the first mask material film so as to cover the first resist pattern; forming a second resist pattern on the second mask material film; carrying out etchback of the second mask material film so as to expose the first resist pattern and the first mask material film, and simultaneously, transferring the second resist pattern to the second mask material film; processing the first and second resist patterns and the first mask material film simultaneously which are exposed, while leaving the second mask material film of which etchback is carried out; and processing the workpiece film which exposes under the first mask material film.

A method of manufacturing a semiconductor device according to another embodiment, includes: forming a first mask material film on a workpiece film formed on a semiconductor substrate; forming a first section where a third mask material film does not exist and a second section where the third mask material film exists, on the first mask material film; forming a resist pattern on the first mask material film and the third mask material film; forming a second mask material film having a desired film thickness on the first mask material film and the third mask material film so as to cover the resist pattern; carrying out etchback of the second mask material film so as to expose the resist pattern and the first mask material film; processing the resist pattern and the first mask material film simultaneously which are exposed, while leaving the second mask material film of which etchback is carried out; and processing the workpiece film which exposes under the first mask material film.

BRIEF DESCRIPTION OF THE DRAWING

FIGS. 2A to 2H are transverse cross-sectional views schematically showing another example of the method of manufacturing a semiconductor device in a second embodiment according to the invention.

FIGS. 3A to 3J are transverse cross-sectional views schematically showing another example of the method of manufacturing a semiconductor device in a third embodiment according to the invention.

FIG. 4A is a cross-sectional view, FIG. 4E is a cross-sectional view, FIG. 4F is a plan view showing a cross-sectional structure shown in FIG. 4E from above, FIG. 4G is a cross-sectional view taken along the line IVG-IVG in FIG. 4F, FIG. 4H is a cross-sectional view, FIG. 4I is a plan view showing a cross-sectional structure shown in FIG. 4H from above, FIG. 4J is a cross-sectional view, FIG. 4K is a plan view showing a cross-sectional structure shown in FIG. 4J from above, FIG. 4L is a cross-sectional view taken along the line IVL-IVL in FIG. 4K, FIG. 4M is a cross-sectional view, FIG. 4N is a plan view showing a cross-sectional structure shown in FIG. 4M from above, FIG. 4O is a cross-sectional view taken along the line IVO-IVO in FIG. 4N, FIG. 4U is a cross-sectional view taken along the line IVU-IVU in FIG. 4T.

DETAILED DESCRIPTION

First Embodiment

FIGS. 1A to 1G are transverse cross-sectional views schematically showing one example of a method of manufacturing a semiconductor device in the first embodiment according to the invention. Further, the left side of each of the FIGS. 1A to 1G shows a first section 10A and the right side shows a second section 10B. Hereinafter, a case will be explained, that a line and space pattern having a pitch of 40 nm and a line width of 20 nm is formed in the first section 10A and a line and space pattern having a pitch of 120 nm and a line width of 20 nm is formed in the second section 10B.

Here, the second section 10B can be formed within the first section 10A and can be also formed outside the first section 10A (this is similarly applicable to the other embodiments described below). Further, patterns in the first section 10A correspond to, for example, periodic patterns in a cell of a semiconductor memory such as an NAND type flash memory, and patterns in the second section 10B correspond to, for example, peripheral circuit patterns or nonperiodic patterns in the cell (this is similarly applicable to the other embodiments described below).

Figure 1A:
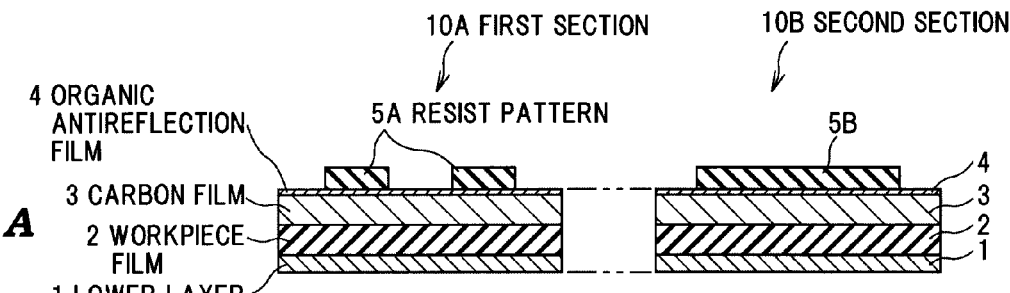
FIGS. 1A to 1G are transverse cross-sectional views schematically showing one example of a method of manufacturing a semiconductor device in a first embodiment according to the invention.

First, as shown in FIG. 1A, a workpiece film 2 made of $SiO_2$ and the like is formed so as to have a film thickness of 200 nm on a silicon substrate (semiconductor substrate) via a lower layer film 1, and a carbon film 3 (a first mask material film) including carbon as a main component is formed so as to have a film thickness of 200 nm on the workpiece film 2.

The lower layer film 1 is, for example, a film formed on the semiconductor substrate, and is configured to have a single layer or plural layers. And, the lower layer film 1 can be replaced with the semiconductor substrate.

The workpiece film 2 is not limited to $SiO_2$, but can be a gate material and the like such as polysilicon.

The carbon film 3 is formed by, for example, a CVD (Chemical Vapor Deposition) method, a sputtering method, a coating method or the like.

Next, an organic antireflection film 4 is formed on the carbon film 3 so as to have a film thickness of 80 nm, and a chemically-amplified ArF resist is formed on the organic antireflection film 4 so as to have a film thickness of 100 nm. The 80 nm in the film thickness of the organic antireflection film 4 is shown as an example, and it is preferable to use thinner films than 80 nm. (This is similarly applicable to the other embodiments described below). Next, a latent image of a line and space pattern having a pitch of 80 nm and a line width of 40 nm is formed in a first section 10A of the chemically-amplified ArF resist by an ArF liquid immersion exposure device having NA of not less than 1.3 via a reticle, and a latent image of a pattern having a line width of 120 nm is formed in a second section 10B. Next, PEB (Post Exposure Bake) and development are carried out on a hot plate so as to form resist patterns 5A, 5B.

It is preferable that a reflectance at the interface between the resist patterns 5A, 5B and the organic antireflection film 4 is not more than 1%. Further, if the reflectance at the interface between the resist patterns 5A, 5B and the carbon film 3 is low, there is no need to form the organic antireflection film 4.

Figure 1B:
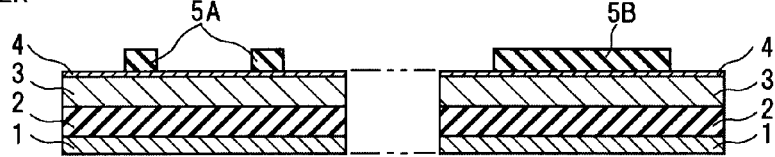

Next, as shown in FIG. 1B, the line widths of the resist patterns 5A, 5B are slimmed by 20 nm so as to form the resist pattern 5A (core material) having a line width of 20 nm in the first section 10A and to form the resist pattern 5B (core material) having a line width of 100 nm in the first section 10B.

The slimming method includes a dry etching by a plasma containing oxygen or by a development by using TMAH (Tetra Methyl Ammonium Hydroxide) aqueous solution due to that alkaline solubilization by an acid medicinal solution is applied to the surface of the resist. In the embodiment, the slimming is carried out by developing for 30 seconds in an aqueous solution containing 2.38 wt % of TMAH and rinsing with pure water.

Further, the slimming can be also achieved by being partially isotropically-etched at the dry etching of the organic antireflection film 4 described below. And, in order to reduce an amount of the slimming, it can be used to preliminarily adjust an exposure condition or a mask dimension so that the line widths of the resist patterns 5A, 5B become thinner than 40 nm, and to form a desired pattern can be formed. Further, the above-mentioned slimming is not indispensable. And, an amount of the slimming can be appropriately adjusted so that the finished dimension after the processing becomes a desired dimension.

Figure 1C:
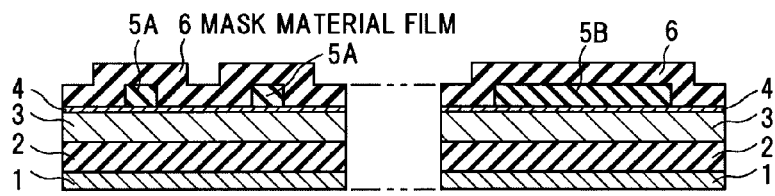

Next, as shown in FIG. 1C, a mask material film (second mask material film) 6 is formed on the resist patterns 5A, 5B which are slimmed, so as to have a film thickness of 20 nm which is almost the same as an objective pattern width.

The mask material film 6 includes, for example, $SiO_2$, SiN, polysilicon, amorphous silicon and the like. The film forming method includes, for example, the CVD method, the sputtering method, the coating method and the like. It is preferable that the film thickness of the mask material film 6 is almost homogeneous, and then, LP-CVD (Lower Pressure-Chemical Vapor Deposition) method and the like can be preferably used, which can form the resist patterns 5A, 5B at the temperature of not more than 200 degree C. at which shape degradation is not caused in the resist patterns 5A, 5B. In the embodiment, the mask material film 6 is formed of $SiO_2$ by using the LP-CVD method.

Figure 1D:
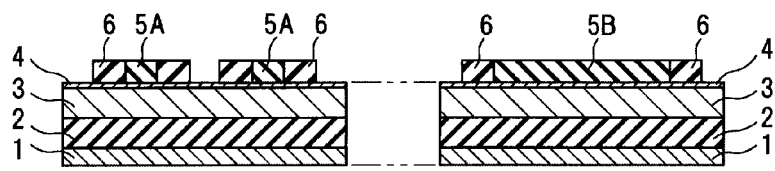

Next, as shown in FIG. 1D, an etchback of the mask material film 6 is carried out by almost 20 nm by using a plasma containing fluorine so that the surfaces of the resist patterns 5A, 5B are exposed. Due to this, the mask material film 6 is formed as a sidewall pattern on the side surfaces of the resist patterns 5A, 5B which are core materials.

Figure 1E:
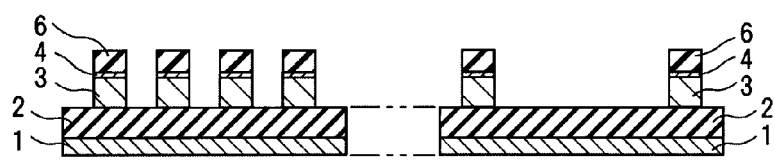

Next, as shown in FIG. 1E, the resist patterns 5A, 5B, the organic antireflection film 4 and the carbon film 3 which are exposed are simultaneously anisotropically-etched (processed in a lump) at the same processing conditions by using, for example, a plasma containing oxygen, while leaving the mask material film 6. By this, a line and space pattern having a pitch of 40 nm and a line width of 20 nm is formed in the first section 10A, the line and space pattern is formed including the carbon film 3 having small aspect ratio (height:width) and being prevented from the collapse of pattern, and a line and space pattern is formed including the carbon film 3 having a line width of 20 nm is formed in the second section 10B, the line and space pattern having a small aspect ratio (height: width) and being prevented from the collapse of pattern. Further, the processing of the resist includes the elimination thereof.

Figure 1F:

Next, as shown in FIG. 1F, after the mask material film 6 is eliminated, the pattern is transferred to the workpiece film 2 by using the above-mentioned carbon film 3 as a mask based on the dry etching. The elimination of the mask material film 6 and the pattern transfer by using the carbon film 3 as a mask can be carried out in a lump. Here, at the processing of the workpiece film 2, not only the mask material film 6 made of the same material as that of the workpiece film 2, but also parts of the carbon film 3 and the organic antireflection film 4 which have a low mask performance are eliminated. Therefore, FIG. 1F shows, as an example, a state that the organic antireflection film 4 is eliminated. Further, according to the selection of the materials, the pattern can be transferred to the workpiece film 2 by using the mask material film 6 as a mask before the elimination of the mask material film 6.

Figure 1G:

Next, as shown in FIG. 1G, the above-mentioned carbon film 3 is eliminated by a plasma ashing which uses oxygen gas, so that a line and space pattern having a pitch of 40 nm and a line width of 20 nm is formed in the first section 10A of the workpiece film 2 on the silicon substrate 1, and a pattern having a line width of 20 nm is formed in the second section 10B.

Advantages of the First Embodiment

According to the first embodiment, the following advantages are obtained.
(1) The collapse of the pattern can be effectively prevented, since in case of forming a pattern having a dimension which exceeds an exposure resolution limit in lithography method, the pattern formation can be carried out by processing from the core material pattern to the workpiece film based on using the dry etching instead of a wet treating which causes stress between the patterns such as surface tension, while using the sidewall patterns having a low aspect ration as a mask.
(2) Number of processes can be reduced, since the elimination of the core material and the etching of the carbon film 3 as a lower layer of the core material can be carried out by one process without changing the gas condition (for example, gaseous species).
(3) Occurrence of defect can be effectively prevented, the defect occurring, for example, due to adherence of particles at the carrying work between processes, and decrease in process yield can be reduced, since from the elimination of the core material to the elimination of the carbon film 3 can be carried out in one dry etching device.
(4) Variation in dimension can be reduced and the process yield can be enhanced, since the number of processes can be reduced.
(5) High-resolution resist materials can be used, since it becomes unnecessary for the resist to have the resistance properties to the dry etching.

Second Embodiment

FIGS. 2A to 2H are transverse cross-sectional views schematically showing one example of a method of manufacturing a semiconductor device in the second embodiment according to the invention. Further, the left side of each of the FIGS. 2A to 2H shows a first section 10A and the right side shows a second section 10B. Hereinafter, a case will be explained, that a line and space pattern having a pitch of 40 nm and a line width of 20 nm is formed in the first section 10A and a pattern having a line width of 100 nm is formed in the second section 10B. The second embodiment has the same processes in the first section 10A as the first embodiment has, but the second embodiment has different processes in the second section 10B from those of the first embodiment.

First, as shown in FIG. 2A, similarly to the first embodiment, the workpiece film 2 made of $SiO_2$ and the like is formed so as to have a film thickness of 200 nm on the silicon substrate (semiconductor substrate) via the lower layer film 1, and the carbon film 3 (a first mask material film) is formed on the workpiece film 2 so as to have a film thickness of 200 nm, the organic antireflection film 4 is formed on the carbon film 3 so as to have a film thickness of 80 nm, and the chemically-amplified ArF resist is formed on the organic antireflection film 4 so as to have a film thickness of 100 nm.

Next, a line and space pattern having a pitch of 80 nm and a line width of 40 nm is exposed in the first section 10A of the chemically-amplified ArF resist by the ArF liquid immersion exposure device having NA of not less than 1.3 via a reticle, and the second section 10B is exposed in the whole surface. Next, the PEB (Post Exposure Bake) and development are carried out on the hot plate so as to form the resist pattern 5A.

Next, as shown in FIG. 2B, the line width of the resist pattern 5A (core material) is slimmed by 20 nm by means of developing the resist pattern 5A for 30 seconds in an aqueous solution containing 2.38 wt % of TMAH and rinsing with pure water, so as to form the resist pattern 5A having a line width of 20 nm. The slimming can be also carried out to the resist pattern 5B.

Further, the slimming can be also achieved by being partially isotropically-etched at the dry etching of the organic antireflection film 4. And, in order to reduce an amount of the slimming, it is preferable to preliminarily adjust an exposure condition or a mask dimension so that the line width of the resist pattern 5A become thinner than 40 nm, and to form a desired pattern can be formed. Further, the above-mentioned slimming is not indispensable.

Next, as shown in FIG. 2C, the mask material film (second mask material film) 6 made of $SiO_2$ is formed on the resist pattern 5A being slimmed in the first section 10A, and on the second section 10B where no patterns exist by the LP-CVD method, so as to have a film thickness of 20 nm which is almost the same as an objective pattern width on the first section 10A. In this case, the organic antireflection film 4 can be formed on the mask material film 6 in the second section 10B as necessary.

Next, as shown in FIG. 2D, the chemically-amplified ArF resist is formed on the second section 10B where no patterns exist so as to have a film thickness of 150 nm. Next, a matching exposure is carried out by using the ArF exposure device having NA of 0.85 and further, a development treatment is applied, so as to form the resist pattern 5B having a line width of 100 nm in the chemically-amplified ArF resist having the film thickness of 150 nm. The formation of the resist pattern 5B can be also carried out by using a KrF exposure device or a MUV (Mid UV) exposure device dependent on the pattern size.

Next, as shown in FIG. 2E, an etchback of the above-mentioned mask material film 6 is carried out by almost 20 nm by using a plasma containing fluorine so that the surfaces of the resist pattern 5A in the first section 10A and the organic antireflection film 4 in the first section 10A and the second section 10B, are exposed. Due to this, in the first section 10A, the mask material film 6 is formed as the sidewall pattern on the side surfaces of the resist pattern 5A which is the core material. At the time, the mask material film 6 in the second section 10B is not processed since it is protected by the resist pattern 5B.

Next, as shown in FIG. 2F, the resist pattern 5A, the organic antireflection film 4 and the carbon film 3 which are exposed are simultaneously anisotropically-etched by using a plasma containing oxygen, while leaving the mask material film 6.

By this, a line and space pattern having a pitch of 40 nm and a line width of 20 nm is formed in the first section 10A, the line and space pattern is formed including the carbon film 3 having a small aspect ratio (height:width) and being prevented from the collapse of pattern.

On the other hand, in the second section 10B, the etching stops at the time when the resist pattern 5B is eliminated and a line pattern having a line width of 100 nm is transferred to the organic antireflection film 4 and the carbon film 3, since a part of the mask material film 6 which has the line pattern having a line width of 100 nm still remains.

Next, as shown in FIG. 2G, after the mask material film 6 is eliminated, the pattern is transferred to the workpiece film 2 by using the above-mentioned carbon film 3 as a mask based on the dry etching. Here, at the processing of the workpiece film 2, not only the mask material film 6 made of the same material as that of the workpiece film 2, but also parts of the carbon film 3 and the organic antireflection film 4 which have a low mask performance are eliminated. Therefore, FIG. 2G shows, as an example, a state that the organic antireflection film 4 is eliminated.

Next, as shown in FIG. 2H, the above-mentioned carbon film 3 is eliminated by a plasma ashing which uses oxygen gas, so that a line and space pattern having a pitch of 40 nm and a line width of 20 nm is formed in the first section 10A of the workpiece film 2 on the silicon substrate 1, and a pattern having a line width of 100 nm is formed in the second section 10B.

Advantages of the Second Embodiment

According to the second embodiment, in addition to the advantages of the first embodiment, an advantage is further obtained, that an independent patterning can be carried out in the second section 10B.

Third Embodiment

FIGS. 3A to 3J are transverse cross-sectional views schematically showing one example of a method of manufacturing a semiconductor device in the second embodiment according to the invention. Further, the left side of each of the FIGS. 3A to 3J shows a first section 10A and the right side shows a second section 10B. Hereinafter, a case will be explained, that a line and space pattern having a pitch of 40 nm and a line width of 20 nm is formed in the first section 10A and a pattern having a line width of 100 nm is formed in the second section 10B. The third embodiment has the same pattern to be objected as the second embodiment has, but the third embodiment has different processes in the first and second sections 10A, 10B from those of the second embodiment.

Figure 3A:
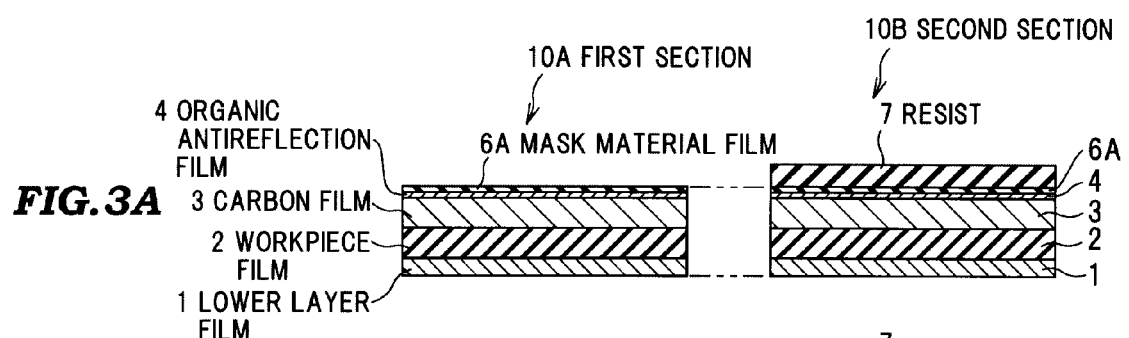

First, as shown in FIG. 3A, similarly to the first and second embodiments, the workpiece film 2 made of $SiO_2$ and the like is formed on the silicon substrate (semiconductor substrate) via the lower layer film 1 so as to have a film thickness of 200 nm, and the carbon film 3 (a first mask material film) is formed on the workpiece film 2 by the CVD method so as to have a film thickness of 200 nm, the organic antireflection film 4 is formed on the carbon film 3 so as to have a film thickness of 80 nm.

Next, a mask material film (a third mask material film) 6A made of $SiO_2$ or the like having a film thickness of 30 nm is formed on the above-mentioned organic antireflection film 4, a resist 7 is formed on the third mask material film 6A, and then a first section 10A where the resist 7 does not exist and the second section 10B where the resist remains are formed by a KrF exposure device having NA of 0.75.

Figure 3B:
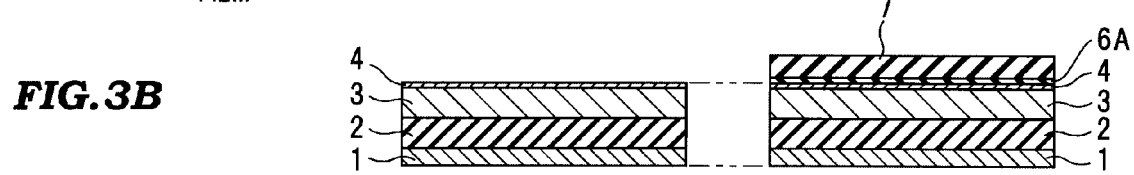

Next, as shown in FIG. 3B, the above-mentioned mask material film 6A in the first section 10A is eliminated by a dry etching or a wet etching, so that the organic antireflection film 4 is exposed in the first section 10A.

Figure 3C:
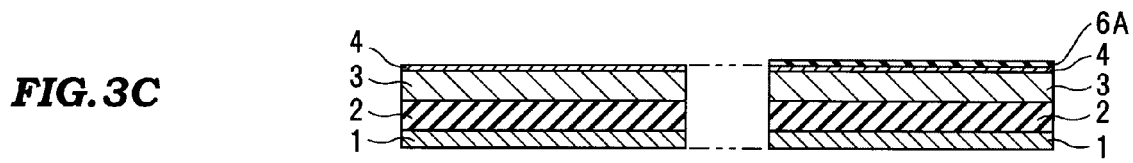

Next, as shown in FIG. 3C, the resist 7 is eliminated by using a thinner. Further, the resist 7 can be also eliminated by using a liquid mixture of sulfuric acid and hydrogen peroxide solution, or the like.

Figure 3D:
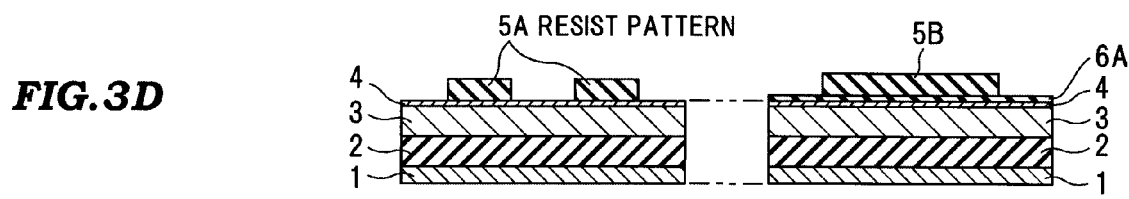

Next, as shown in FIG. 3D, a chemically-amplified ArF resist is formed on the organic antireflection film 4 so as to have a film thickness of 100 nm. Next, a latent image of a line and space pattern having a pitch of 80 nm and a line width of 40 nm is formed in the first section 10A of the chemically-amplified ArF resist by the ArF liquid immersion exposure device having NA of not less than 1.3 via a reticle, and a latent image of a pattern having a line width of 120 nm is formed in the second section 10B. Next, PEB (Post Exposure Bake) and development are carried out on the hot plate so as to form the resist patterns 5A, 5B.

Further, instead of forming the organic antireflection film 4 in the process shown in FIG. 3A, the organic antireflection film 4 can be formed before the process shown in FIG. 3D.

Figure 3E:
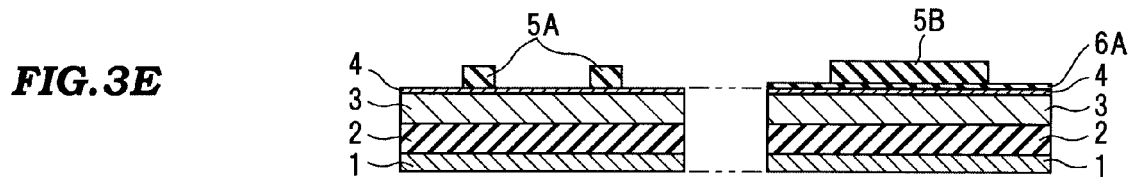

Next, as shown in FIG. 3E, the line widths of the resist patterns 5A, 5B are slimmed by 20 nm by developing for 30 seconds in an aqueous solution containing 2.38 wt % of TMAH and rinsing with pure water, so as to form the resist pattern 5A (core material) having a line width of 20 nm in the first section 10A and to form the resist pattern 5B (core material) having a line width of 100 nm in the first section 10B.

Further, the slimming can be also achieved by being partially isotropically-etched at the dry etching of the organic antireflection film 4. And, in order to reduce an amount of the slimming, it is preferable to preliminarily adjust an exposure condition or a mask dimension so that the line width of the resist pattern 5A becomes thinner than 40 nm, and to form a desired pattern can be formed. Further, the above-mentioned slimming is not indispensable.

Next, as shown in FIG. 3F, a mask material film 6B made of $SiO_2$ is formed by the LP-CVD method on the resist patterns 5A, 5B which are slimmed, so as to have a film thickness of 20 nm which is almost the same as an objective pattern width.

The mask material film 6B can include the same composition as that of the mask material film 6A and can also be composed of a film having an etching resistance in a processing of the carbon film 3 described below.

Next, as shown in FIG. 3G, an etchback of the mask material film (the second mask material film) 6B is carried out by almost 20 nm by using a plasma containing fluorine and simultaneously an etchback of the mask material film 6A is carried out, so that the surfaces of the resist patterns 5A, 5B are exposed. Due to this, the mask material film 6B is formed on the first section 10A as a sidewall pattern on the side surfaces of the resist pattern 5A which are core materials. At the time, the mask material film 6A under the resist pattern 5B in the second section 10B is not processed since it is protected by the resist pattern 5B.

Next, as shown in FIG. 3H, the resist patterns 5A, 5B, the organic antireflection film 4 and the carbon film 3 which are exposed are simultaneously anisotropically-etched by using a plasma containing oxygen, while leaving the mask material films 6A, 6B. By this, a line and space pattern having a pitch of 40 nm and a line width of 20 nm is formed in the first section 10A, the line and space pattern is formed including the carbon film 3 having a small aspect ratio (height:width)

and being prevented from the collapse of pattern. On the other hand, in the second section 10B, the etching stops at the time when the resist pattern 5B is eliminated and a pattern having a line width of 120 nm is transferred to the carbon film 3, since a part of the mask material film 6A which has the pattern having a line width of 120 nm still remains.

Next, as shown in FIG. 3I, the pattern is transferred to the workpiece film 2 by using the above-mentioned carbon film 3 as a mask based on the dry etching such as an oxygen plasma, a RIE (Reactive Ion Etching).

Next, as shown in FIG. 3J, the above-mentioned carbon film 3 is eliminated by a plasma ashing which uses oxygen gas, so that a line and space pattern having a pitch of 40 nm and a line width of 20 nm is formed in the first section 10A of the workpiece film 2 on the silicon substrate 1, and a pattern having a line width of 120 nm is formed in the second section 10B.

Advantages of the Third Embodiment

According to the third embodiment, the same advantages as those of the second embodiment can be obtained. Further, a fine pattern in the first section 10A and a large pattern in the second section 10B can be formed by using the same mask, so that misalignment at the matching can be effectively prevented.

Fourth Embodiment

Figure 4A:
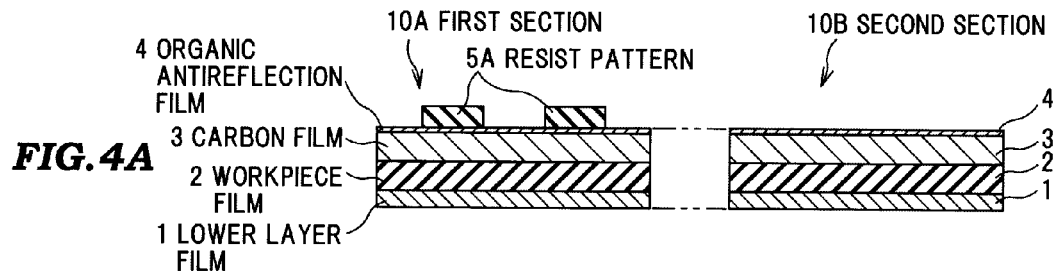
FIGS. 4A to 4U are views schematically showing one example of the method of manufacturing a semiconductor device in a fourth embodiment according to the invention.
Figure 4B:
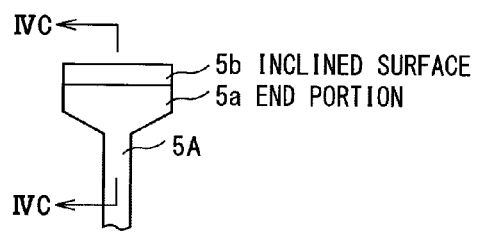
FIG. 4B is a plan view schematically showing a cross-sectional structure shown in FIG. 4A from above.
Figure 4C:
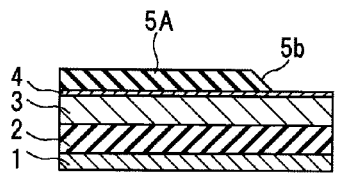
FIG. 4C is a cross-sectional view taken along the line IVC-IVC in FIG. 4B.
Figure 4D:
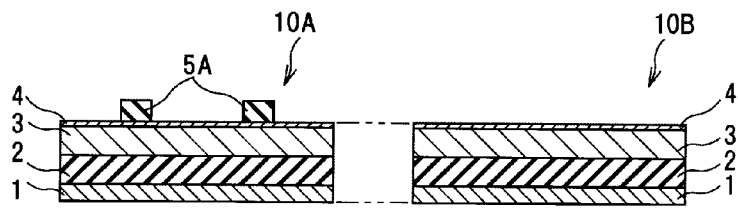
FIG. 4D is a cross-sectional view.
Figure 4P:
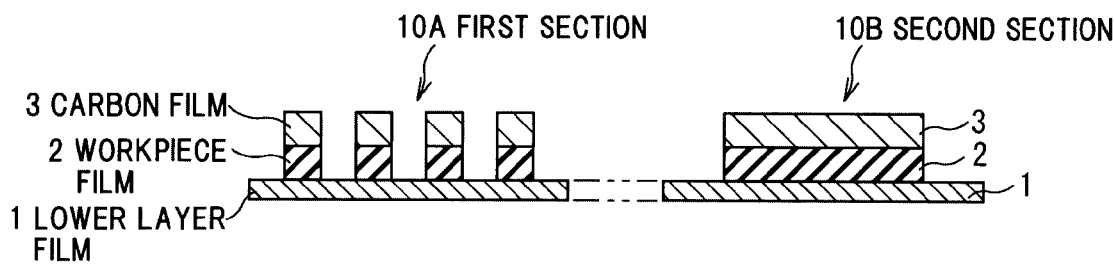
FIG. 4P is a cross-sectional view.
Figure 4Q:
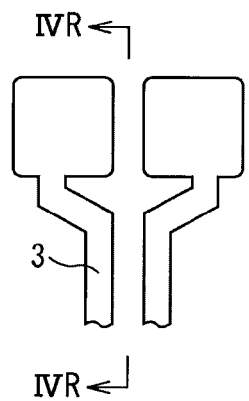
FIG. 4Q is a plan view showing a cross-sectional structure shown in FIG. 4P from above.
Figure 4R:
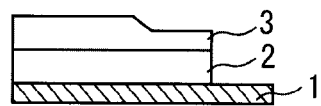
FIG. 4R is a cross-sectional view taken along the line IVR-IVR in FIG. 4Q.
Figure 4S:
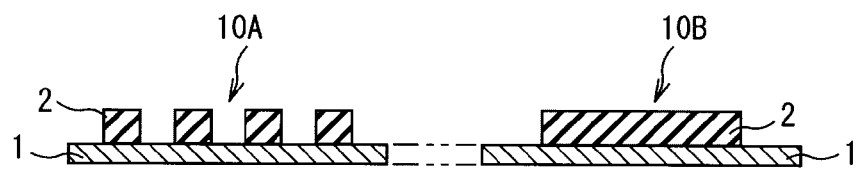
FIG. 4S is a cross-sectional view.
Figure 4T:
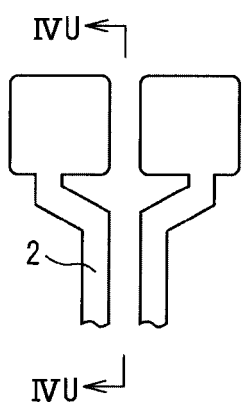
FIG. 4T is a plan view showing a cross-sectional structure shown in FIG. 4S from above.
Figure 4U:
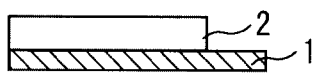

FIGS. 4A to 4U are views schematically showing one example of the method of manufacturing a semiconductor device in a fourth embodiment according to the invention, FIG. 4A is a cross-sectional view, FIG. 4B is a plan view schematically showing a cross-sectional structure shown in FIG. 4A from above, FIG. 4C is a cross-sectional view taken along the line IVC-IVC in FIG. 4B, FIG. 4D is a cross-sectional view, FIG. 4E is a cross-sectional view, FIG. 4F is a plan view showing a cross-sectional structure shown in FIG. 4E from above, FIG. 4G is a cross-sectional view taken along the line IVG-IVG in FIG. 4F, FIG. 4H is a cross-sectional view, FIG. 4I is a plan view showing a cross-sectional structure shown in FIG. 4H from above, FIG. 4J is a cross-sectional view, FIG. 4K is a plan view showing a cross-sectional structure shown in FIG. 4J from above, FIG. 4L is a cross-sectional view taken along the line IVL-IVL in FIG. 4K, FIG. 4M is a cross-sectional view, FIG. 4N is a plan view showing a cross-sectional structure shown in FIG. 4M from above, FIG. 4O is a cross-sectional view taken along the line IVO-IVO in FIG. 4N, FIG. 4P is a cross-sectional view, FIG. 4Q is a plan view showing a cross-sectional structure shown in FIG. 4P from above, FIG. 4R is a cross-sectional view taken along the line IVR-IVR in FIG. 4Q, FIG. 4S is a cross-sectional view, FIG. 4T is a plan view showing a cross-sectional structure shown in FIG. 4S from above, and FIG. 4U is a cross-sectional view taken along the line IVU-IVU in FIG. 4T. This embodiment is configured to have a process which is added to the processes of the second embodiment, that a contact fringe pattern is formed in the end portion of the resist pattern 5A of the line and space in the first section 10A, and other processes are the same as those of the second embodiment.

First, as shown in FIG. 4A, similarly to the second embodiment, the workpiece film 2 made of $SiO_2$ and the like is formed so as to have a film thickness of 200 nm on the silicon substrate (semiconductor substrate) via the lower layer film 1, and the carbon film 3 (a first mask material film) including carbon as a main component is formed so as to have a film thickness of 200 nm on the workpiece film 2.

Next, the organic antireflection film 4 is formed on the carbon film 3 so as to have a film thickness of 80 nm, and the chemically-amplified ArF resist is formed on the organic antireflection film 4 so as to have a film thickness of 100 nm. Next, a latent image of a line and space pattern having a pitch of 80 nm and a line width of 40 nm is formed in the first section 10A of the chemically-amplified ArF resist by the ArF liquid immersion exposure device having NA of not less than 1.3 via a reticle. Next, the PEB (Post Exposure Bake) and development are carried out on the hot plate so as to form the resist pattern 5A. Next, an aqueous solution of an acidic resin is coated on the resist pattern 5A and is baked on the hot plate at the temperature of 150 degree C. for 60 seconds.

When the resist pattern 5A having a line width of 40 nm is formed in the first section 10A, as shown in FIGS. 4B, 4C, an inclined surface 5b is formed in the end portion 5a of a pentagon-shaped line of the resist pattern 5A. The inclined surface 5b can be formed by a method using an asymmetric lighting condition in an exposure device, and a method using an exposure amount monitor pattern or the like which is independent of a focus position of the exposure device, for example, as disclosed in JP-A-2000-310850, JP-A-2001-102282, JP-A-2002-25895, and JP-A-2002-299205. Further, the method of forming the inclined surface 5b is not limited to the above mentioned methods. Furthermore, the end portion 5a of the line can be also formed so as to have an optical image with lower contrast which is formed by using a light source having a wavelength longer than that of the light source of the exposure device used at the time of forming the above-mentioned fine pattern, and additionally exposing the above-mentioned end portion 5a of the line of the resist pattern 5A. And, the end portion 5a of the line can be also formed so as to have an optical image having a slope inside the resist which is formed by utilizing that a light absorption of the above-mentioned resist is increased due to using a light source having a wavelength shorter than that of the light source of the exposure device which is used at the time of forming the above-mentioned fine pattern, and additionally exposing the above-mentioned end portion 5a of the line of the resist pattern 5A. Further, the end portion 5a of the resist pattern 5A is not particularly limited to the pentagonal shape, if it is capable of forming a desired slope in the end portion of the line.

Next, as shown in FIG. 4D, the line width of the resist pattern 5A is slimmed by 20 nm by means of developing the resist pattern 5A for 30 seconds in an aqueous solution containing 2.38 wt % of TMAH and rinsing with pure water, so as to form the resist pattern (core pattern) 5A having a line width of 20 nm in the first section 10A.

Next, as shown in FIGS. 4E to 4G, the mask material film (second mask material film) 6 made of $SiO_2$ is formed on the resist pattern 5A being slimmed in the first section 10A, and on the second section 10B where no patterns exist by the LP-CVD method, so as to have a film thickness of 20 nm which is almost the same as an objective pattern width on the first section 10A.

The film thickness of the mask material film 6 formed on the inclined surface 5b of the resist pattern 5A becomes $20/\cos \theta$ nm, if the angle of the above-mentioned inclined surface 5b is θ. For example, if the θ is 45 degree, it becomes almost 28 nm (if the θ is 60 degree, it becomes almost 40 nm). On the other hand, the film thickness of the mask material film 6 formed on the perpendicular sidewalls of the resist pattern 5A becomes almost 110 nm by adding the film thickness of the mask material film 6 (20 nm) to the film thickness of the resist reduced by the slimming (90 nm).

Next, as shown in FIG. 4H, the chemically-amplified ArF resist is formed on the second section 10B where no patterns exist so as to have a film thickness of 150 nm. Next, a matching exposure is carried out by using the ArF exposure device having NA of 0.85, so as to form the resist pattern 5B having a line width of 100 nm, and as shown in FIG. 4I, to form a pair of rectangular resist patterns 16 having a side of 250 nm as the contact fringe pattern so as to include a part of the region of the inclined surface 5b, in the chemically-amplified ArF resist having the film thickness of 150 nm.

Next, as shown in FIGS. 4J to 4L, an etchback of the above-mentioned mask material film 6 on the inclined surface 5b is carried out by almost 28 nm by using a plasma containing fluorine so that the surfaces of a part of the resist pattern 5A on the first section 10A and the region of the inclined surface 5b, are exposed. Due to this, in the first section 10A, the mask material film 6 is formed as the sidewall pattern on the side surfaces of the resist pattern 5A which is the core material. At the time, the mask material film 6 in the second section 10B is not processed since it is protected by the resist pattern 5B. Similarly, the SiO$_2$ film under the rectangular resist patterns 16 is not processed, since it is also protected.

Next, as shown in FIGS. 4M to 4O, the resist pattern 5A, the organic antireflection film 4 and the carbon film 3 are continuously anisotropically-etched by using a plasma containing oxygen, while using the mask material film 6 as a mask. By this, a line and space pattern having a pitch of 40 nm and a line width of 20 nm is formed in the first section 10A, the line and space pattern is formed including the carbon film 3 having a small aspect ratio (height:width).

On the other hand, in the second section 10B and a part of the rectangular resist patterns 16, the etching stops at the time when the resist pattern 5B is eliminated and a line pattern having a line width of 100 nm is transferred to the organic antireflection film 4 and the carbon film 3, since a part of the mask material film 6 which has the line pattern having a line width of 100 nm still remains. Further, simultaneously, the sidewalls of the mask material film 6 connecting at the end portion of the line and space having a line width of 20 nm can be eliminated (cut of closed loop), and the contact fringe can be formed at the end portion of the line.

Next, as shown in FIGS. 4P to 4R, the pattern is transferred to the workpiece film 2 by using the above-mentioned carbon film 3 as a mask based on the dry etching. At the time, as shown in FIG. 4R, in a part of the rectangular resist patterns 16, the carbon film 3 remains in the shape of having a step.

Next, as shown in FIGS. 4S to 4U, the above-mentioned carbon film 3 is eliminated by a plasma ashing which uses oxygen gas, so that a line and space pattern having a pitch of 40 nm and a line width of 20 nm is formed in the first section 10A of the workpiece film 2 on the silicon substrate 1, and a pattern having a line width of 100 nm is formed in the second section 10B, and the contact fringe can be formed at the end portion of the line of the pattern having a line width of 20 nm. As shown in FIG. 4U, the step of the carbon film 3 is not transferred to the workpiece film 2.

Further, the formation of the contact fringe is not indispensable, if the end portion of the line of the resist pattern 5A has the slope, and the mask material film 6 formed on the inclined surface 5b is eliminated at the etchback of the mask material film 6 in the subsequent processes so that a part of the loop of the mask material film 6 is opened.

Advantages of the Fourth Embodiment

According to the fourth embodiment, the same advantages as those of the second embodiment can be obtained, and simultaneously, the closed loop of the end portion of the line of the line and space pattern can be separated at the time of etchback. Further, an exposure process for cutting the closed loop can be omitted, which is conventionally needed to be carried out one more time after the transfer of the pattern to the workpiece film.

Fifth Embodiment

Figure 5A:
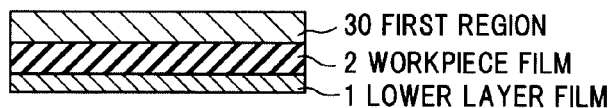
FIGS. 5A to 5I are transverse cross-sectional views schematically showing another example of the method of manufacturing a semiconductor device in a fifth embodiment according to the invention.
Figure 5B:
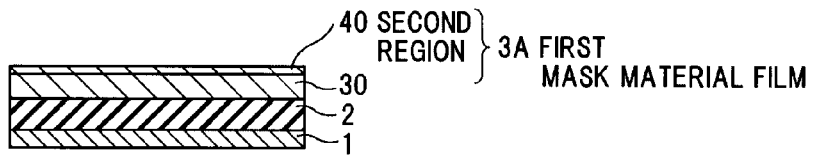
Figure 5C:
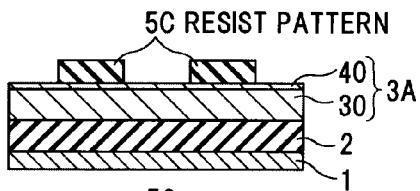
Figure 5D:
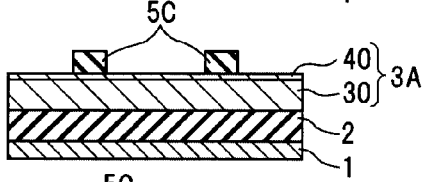
Figure 5E:
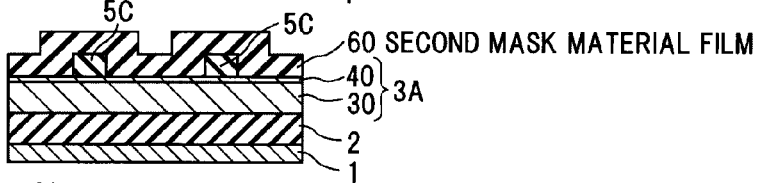
Figure 5F:
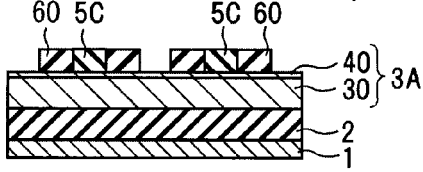
Figure 5G:
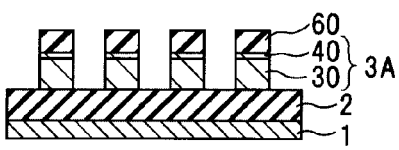
Figure 5H:
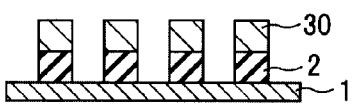
Figure 5I:
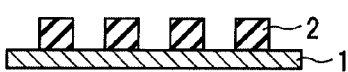
Figure 6:
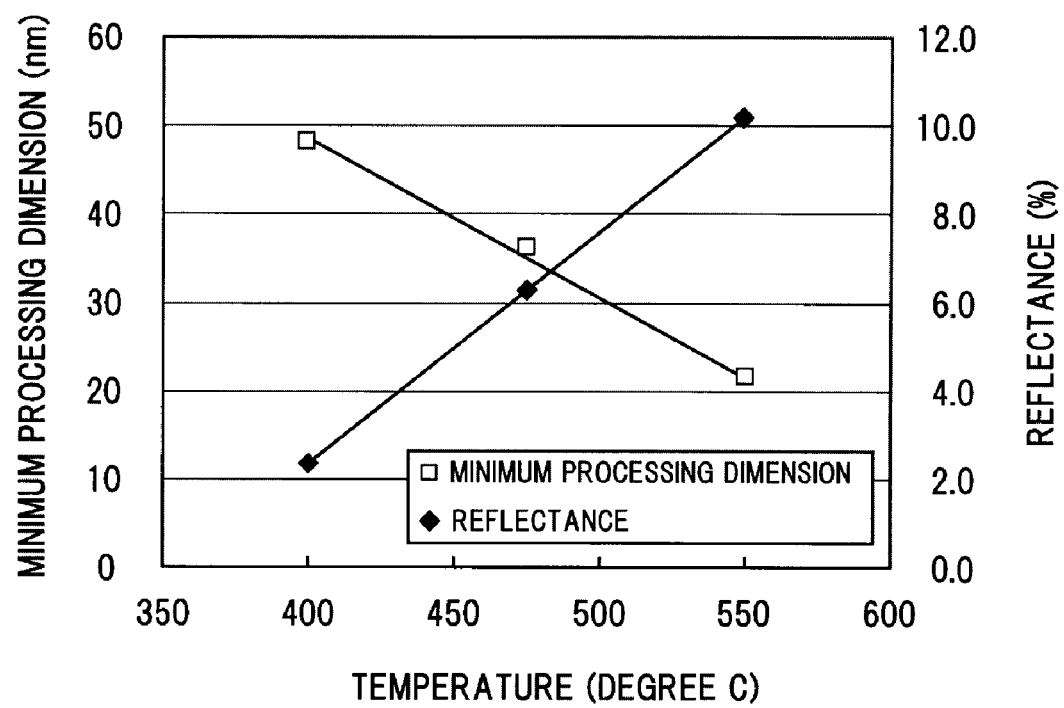
FIG. 6 is a graph schematically showing a relationship between a temperature, and a minimum processing dimension and a reflectance when a carbon film is formed.

FIGS. 5A to 5I are transverse cross-sectional views schematically showing another example of the method of manufacturing a semiconductor device in a fifth embodiment according to the invention, and FIG. 6 is a graph schematically showing a relationship between a temperature, and a minimum processing dimension and a reflectance when a carbon film is formed. In FIG. 6, the horizontal axis shows a temperature, and the vertical axis shows a minimum processing dimension in the left side and a reflectance in the right side, and FIG. 6 shows a relationship between the temperature and the minimum processing dimension, and between the temperature and the reflectance in case of forming the carbon film having a film thickness of 200 nm by the CVD method. Outline square marks (□) in FIG. 6 show values of the minimum processing dimension corresponding to the temperature at which the carbon film is formed, and black diamond-shaped marks (♦) show the reflectance in case of single film corresponding to the temperature at which the carbon film is formed. Here, the minimum processing dimension means a minimum dimension that is capable of processing without generating bend and twist of the carbon film when the RIE processing is applied to silicon oxide film as the workpiece film by using the carbon film as a mask and using a fluorocarbon (CF) based gas. The fifth embodiment differs from the above-mentioned embodiments in that a first region to function as a mask and a second region to function an antireflection film can be formed in the same chamber by changing the temperature condition.

Hereinafter, a method of processing the workpiece film to the line and space pattern as an example of a method of manufacturing a semiconductor device will be explained.

First, the workpiece film 2 is formed via the lower layer film 1.

Next, as shown in FIG. 5A, the first region 30 to function as a mask is formed on the workpiece film 2 by the CVD method according to a first temperature condition, and as shown in FIG. 5B, the second region 40 to function as the antireflection film is formed on the first region 30 by the CVD method according to a second temperature condition changed from the first temperature condition, so as to form a first mask material film 3A including the first and second regions 30, 40.

The first mask material film 3A is, for example, a carbon film including carbon as a main component.

Here, as shown in FIG. 6, the carbon film has a tendency to be capable of providing a strength needed for a mask since the minimum processing dimension of the workpiece film 2 is reduced as the temperature at the film formation is elevated, and decreasing the reflectance of the carbon film as the temperature at the film formation is lowered. Therefore, it is preferable that the carbon film appropriate for a mask is formed at the temperature condition set to a higher temperature side in order to reduce the minimum processing dimension, and that the carbon film appropriate for the antireflection film is formed at the temperature condition set to a lower temperature side in order to reduce the reflectance. Consequently, the first temperature condition is set higher than the second temperature condition, so that the first mask material film 3A including the first region 30 preferable as a mask and the second region 40 preferable as the antireflection film can be formed.

Next, as shown in FIG. 5C, a resist film is formed on the first mask material film 3A, subsequently, a latent image of a line and space pattern is formed on the resist film by the exposure device via a reticle, and next, PEB (Post Exposure Bake) and development are carried out on the hot plate so as to form resist pattern 5C.

Next, as shown in FIG. 5D, the resist pattern 5C is slimmed. Further, since the resist pattern 5C is used as a core material for forming sidewall patterns to be used as a mask, it is not particularly necessary for the resist to be formed so as to have sufficient thickness in view of the resistance properties to the dry etching.

Next, as shown in FIG. 5E, a second mask material film 60 is formed on the resist pattern 5C which is slimmed, so as to have a film thickness which is almost the same as an objective pattern width.

Next, as shown in FIG. 5F, an etchback of the second mask material film 60 is carried out by almost the film thickness of the second mask material film 60 by using a plasma containing fluorine so that the second mask material films 60 are selectively formed as sidewall patterns on the side surfaces of the resist pattern 5C which is the core material. Due to this, the upper surface of the resist pattern 5C and the surface of the first mask material film 3A being located out of a region where the resist pattern 5C and the sidewall patterns of the second mask material film 60 are formed, are exposed.

Next, as shown in FIG. 5G, the resist pattern 5c exposed and the first mask material film 3A under the exposed resist pattern 5c, and the first mask material film 3A exposed are simultaneously anisotropically-etched (processed in a lump) at the same processing conditions by using, for example, a plasma containing oxygen, while leaving the second mask material film 60. At the time, an etching selectivity between the first mask material film 3A and the resist pattern 5C which are made of an organic material, and the second mask material film 60 which is made of an inorganic material can be set to a sufficiently large value, the thickness and the aspect ratio (height:width) of the second mask material film 60 can be set to a small value similarly to the resist film to become the core pattern, and the etching can be carried out without using the wet treatment which generates stress such as surface tension, so that the line and space pattern can be formed, while being prevented from the collapse of pattern. Further, the processing of the resist includes the elimination thereof.

Next, as shown in FIG. 5H, the pattern is transferred to the workpiece film 2 exposed under the first region 30, by using the first mask material film 3A to which a pattern processing is applied, particularly, the above-mentioned first region 30 as a mask based on the dry etching. Here, at the processing of the workpiece film 2, not only the second mask material film 60 made of the same material as that of the workpiece film 2, but also parts of the first mask material film 3A which have a low mask performance are eliminated. Therefore, FIG. 5H shows, as an example, a state that the second region 40 is eliminated. Further, according to the selection of the materials, the pattern can be transferred to the workpiece film 2 by using the first mask material film 3A as a mask after the elimination of the second mask material film 60.

Next, as shown in FIG. 5I, the above-mentioned first region 30 is eliminated by a plasma ashing which uses oxygen gas, so that a line and space pattern of the workpiece film 2 can be obtained on the lower layer film 1. Further, the manufacturing processes shown in FIGS. 5F to 5I can be continuously carried out in the same chamber of a dry etching device, and can be also carried out in the different chamber respectively.

Advantages of the Fifth Embodiment

According to the fifth embodiment, the following advantages are obtained.
(1) The first region 30 to function as a mask and the second region 40 to function as an antireflection film can be separately formed by changing the first temperature condition to the second temperature condition in the same chamber in the process of forming the first mask material film 3A by the CVD method. Therefore, for example, numbers of processes can be reduced in comparison with the case that the organic antireflection film is formed on the mask material film by separate processes, so that production costs of the semiconductor device can be reduced. Further, the collapse of pattern and the separation due to the undercut caused by poor adhesion or difference of etching rate between the antireflection film and the mask material film (carbon film) can be prevented, so that process yield can be enhanced.
(2) The collapse of the pattern can be effectively prevented, since in case of forming a pattern having a dimension which exceeds an exposure resolution limit in photolithography method, the pattern formation can be carried out by processing from the core material pattern to the workpiece film based on using the dry etching instead of a wet treating which causes stress between the patterns such as surface tension, while using the sidewall patterns having a low aspect ration as a mask.
(3) Number of processes can be reduced, since the elimination of the core material and the etching of the carbon film as a lower layer of the core material can be carried out by one process without changing the gas condition (for example, gaseous species).
(4) Occurrence of defect can be effectively prevented, the defect occurring, for example, due to adherence of particles at the carrying work between processes, and decrease in process yield can be reduced, since from the formation of the sidewall patterns by the etchback to the elimination of the carbon film can be carried out in one dry etching device.
(5) Variation in dimension can be reduced and the process yield can be enhanced, since the number of processes can be reduced.
(6) High-resolution resist materials can be used, since it becomes unnecessary for the resist to have the resistance properties to the dry etching.

Sixth Embodiment

The sixth embodiment shows that the first mask material film having functions as a mask and an antireflection film in the fifth embodiment can be practically formed by changing the temperature condition, while providing concrete examples. Further, with regard to the same portions as the fifth embodiment, an explanation will be omitted or simplified. The sixth embodiment has common processes with the fifth embodiment so that it will be explained with reference to FIGS. 5A to 5I.

Hereinafter, a method of processing the workpiece film to the line and space pattern having a pitch of 40 nm and a line width of 20 nm as an example of a method of manufacturing a semiconductor device will be explained.

First, the workpiece film 2 is formed via the lower layer film 1 so as to have a film thickness of 200 nm.

Next, as shown in FIG. 5A, the first region 30 to function as a mask is formed on the workpiece film 2 by the CVD method according to a first temperature condition so as to have a film thickness of 170 nm, and as shown in FIG. 5B, the second region 40 to function as the antireflection film is formed on the first region 30 by the CVD method according to a second temperature condition changed from the first temperature condition so as to have a film thickness of 30 nm, so that a first mask material film 3A including the first and second regions 30, 40 is formed so as to have a film thickness of 200 nm.

As particular conditions of the film formation, a mixed gas of $C_3H_6$/He or $C_2H_2$/He was used, and a pressure was set to 5 to 7 Pa, RF was set to 13.56 MHz (1000 to 2000 W), the first temperature condition was set to 550 degrees C. and the second temperature condition was set to 400 degrees C. Further, the first and second regions 30, 40 can be formed by continuously elevating the temperature at the film formation, and can be also formed by that after the first region 30 has been formed at the first temperature condition, the second region 40 is formed at the second temperature condition being elevated.

Next, as shown in FIG. 5C, the chemically-amplified ArF resist is formed so as to have a film thickness of 120 nm on the first mask material film 3A. Subsequently, a latent image of a line and space pattern having a pitch of 80 nm and a line width of 40 nm is formed on the chemically-amplified ArF resist by the ArF liquid immersion exposure device having NA of not less than 1.3 via a reticle. The reflectance in the first mask material film 3A at the time was 0.475% as a result of calculation. Next, PEB (Post Exposure Bake) and development are carried out on the hot plate so as to form the resist pattern 5C having a film thickness of 100 nm.

Next, as shown in FIG. 5D, the line width of the resist pattern 5C is slimmed by 20 nm.

The slimming method includes a dry etching by a plasma containing oxygen or by a development by using TMAH (Tetra Methyl Ammonium Hydroxide) aqueous solution due to that alkaline solubilization by an acid medicinal solution is applied to the surface of the resist. In the embodiment, the slimming is carried out by developing for 30 seconds in an aqueous solution containing 2.38 wt % of TMAH and rinsing with pure water.

Further, in order to reduce an amount of the slimming, it can be used to preliminarily adjust an exposure condition or a mask dimension so that the line widths of the resist pattern 5C becomes thinner than 40 nm. Further, the above-mentioned slimming is not indispensable, if a pattern having a desired line width can be directly formed.

Next, as shown in FIG. 5E, a second mask material film 60 is formed on the resist pattern 5C which is slimmed, so as to have a film thickness of 20 nm which is almost the same as an objective pattern width.

The second mask material film 60 includes, for example, $SiO_2$, SiN, polysilicon, amorphous silicon and the like can be used. The film forming method includes, for example, the CVD method, the sputtering method, the coating method and the like. It is preferable that the film thickness of the second mask material film 60 is almost homogeneous, and then, LP-CVD (Lower Pressure-Chemical Vapor Deposition) method and the like can be preferably used, which can form the resist pattern 5C at the temperature of not more than 200 degree C. at which shape degradation is not caused in the resist pattern 5C. In the embodiment, the second mask material film 60 is formed of $SiO_2$ by using the LP-CVD method.

Next, as shown in FIG. 5F, an etchback of the second mask material film 60 is carried out by almost 20 nm by using a plasma containing fluorine so that the second mask material films 60 are selectively formed as sidewall patterns on the side surfaces of the resist pattern 5C which is the core material.

Due to this, the upper surface of the resist pattern 5C and the surface of the first mask material film 3A being located out of a region where the resist pattern 5C and the sidewall patterns of the second mask material film 60 are formed, are exposed.

Next, as shown in FIG. 5G, the resist pattern 5c exposed and the first mask material film 3A under the exposed resist pattern 5c, and the first mask material film 3A exposed are simultaneously anisotropically-etched (processed in a lump) at the same processing conditions by using, for example, a plasma containing oxygen, while leaving the second mask material film 60. At the time, the aspect ratio (height:width) of the second mask material film 60 having a pitch of 40 nm and a line width of 20 nm can be set to a small value, and the processing is carried out by the dry etching instead of the wet treatment, so that the line and space pattern can be formed, while being prevented from the collapse of pattern.

Next, as shown in FIG. 5H, the pattern is transferred to the workpiece film 2, by using the first mask material film 3A, particularly, the above-mentioned first region 30 as a mask based on the dry etching. Finally, as shown in FIG. 5I, the above-mentioned first region 30 is eliminated by a plasma ashing which uses oxygen gas, so that a line and space pattern having a pitch of 40 nm and a line width of 20 nm of the workpiece film 2 can be obtained on the lower layer film 1.

Hereinafter, a result of simulation carried out by a computer will be explained.

Figure 7:
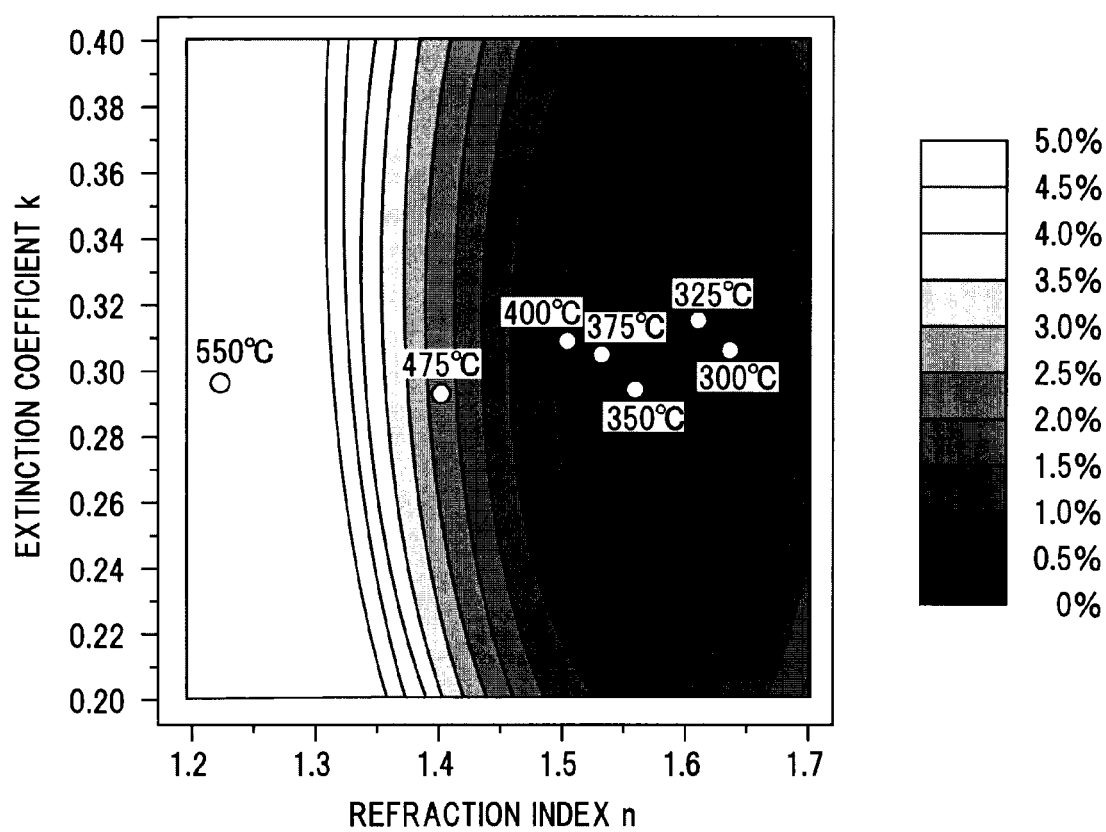
FIG. 7 is a contour drawing schematically showing a relationship between a refraction index and an extinction coefficient, and the reflectance based on a simulation result in a sixth embodiment according to the invention.
Figure 8:
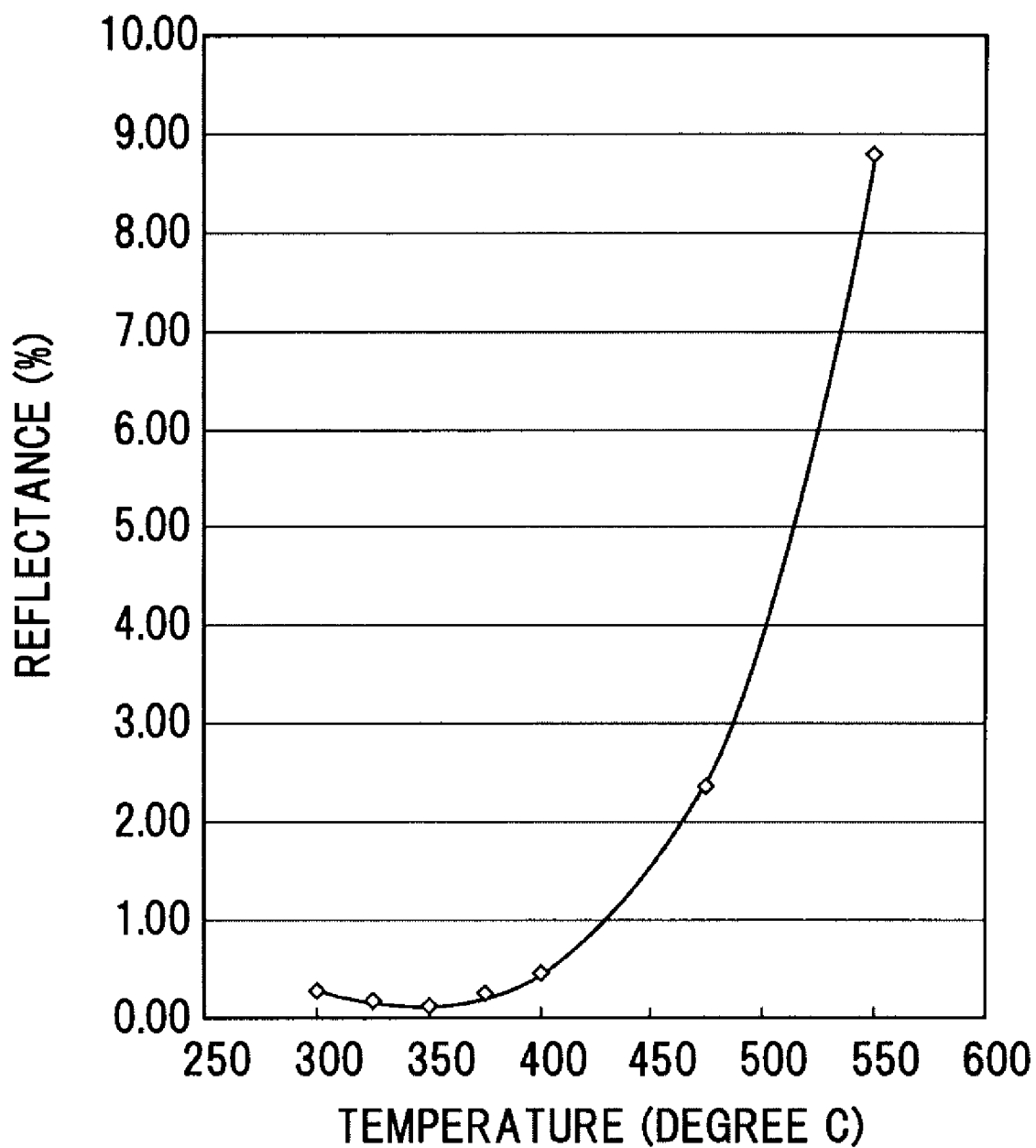
FIG. 8 is a graph schematically showing a relationship between a temperature and the reflectance based on the simulation result in the sixth embodiment according to the invention.

FIG. 7 is a contour drawing schematically showing a relationship between a refraction index and an extinction coefficient, and the reflectance based on a simulation result in a sixth embodiment according to the invention, and FIG. 8 is a graph schematically showing a relationship between a temperature and the reflectance based on the simulation result in the sixth embodiment according to the invention. In FIG. 7, the horizontal axis shows a refraction index (n), and the vertical axis shows an extinction coefficient (k), and FIG. 7 shows that the reflectance becomes higher from the center outward. The refraction index (n) and the extinction coefficient (k) correspond to a real part (n) and an imaginary part (k) in a complex refraction index (N=n+ki), and FIG. 7 is a contour drawing obtained by carrying out the simulation by a computer.

As the conditions of the film formation in the simulation, a mixed gas of $C_3H_6$/He or $C_2H_2$/He was used, and a pressure was set to 5 to 7 Pa, and RF was set to 13.56 MHz (1000 to 2000 W). The simulation is carried out for calculating the imaginary part (k) and refraction index (n) of the second region being formed as described below, by assuming a case that the first region is formed so as to have a film thickness of 170 nm at a temperature of film formation of 550 degree C., and the second region is formed on the first region so as to have a film thickness of 30 nm at a temperature of film formation which is changed, and the resist film is formed so as to have a film thickness of 120 nm.

The reflectance has a tendency as shown in FIG. 6, that is to say, the reflectance is decreased as the temperature at the film formation is lowered, however, according to calculation based on the film thickness and the complex refraction index, there is a lower limit in the tendency, for example, as shown in FIG. 8. It is known that the second region 40 can be decreased in the reflectance up to almost 0.124% due to the temperature condition at the lower limit (almost 350 degree C.).

From a result of simulation described above, it is known that the first region 30 to function as a mask can be formed at the first temperature condition set to a higher temperature side and the second region 40 having the reflectance which allows the second region 40 to function as an antireflection film can be formed at the second temperature condition set to a lower temperature side than the first temperature condition. Consequently, it can be said that the first mask material film 3A having the first and second regions 30, 40 can be adequately formed in one CVD device by changing the temperature condition.

Advantages of the Sixth Embodiment

According to the sixth embodiment, the same advantages as those of the fifth embodiment are obtained.

Further, it should be noted that the present invention is not intended to be limited to the above-mentioned embodiment, and the various kinds of changes thereof can be implemented by those skilled in the art without departing from the gist of the invention.

For example, in the second section 10B in the second embodiment shown in FIG. 2A and the fourth embodiment shown in FIG. 4A, the resist is eliminated to form a region where a pattern does not exist, but the resist can be also left.

Further, in the first to fourth embodiments, as the first mask material film a carbon film is used, but the other materials can be also used. Furthermore, as a method of eliminating the first mask material film, an etching can be also used.

Further, processes constituting each of the embodiments can be arbitrarily combined, without departing from the gist of the invention. For example, the process in the fourth embodiment can be carried out in the other embodiments, that the closed loop of the end portion of the line of the line and space pattern can be separated at the time of the etchback.

Further, the sequence of each process in each of the embodiments can be changed, for example, a plurality of processed can be carried out in parallel and one process can include the other processes, without departing from the gist of the invention.

What is claimed is:

1. A method of manufacturing a semiconductor device, comprising:
    forming a first mask material film on a workpiece film formed on a semiconductor substrate;
    forming a resist pattern directly on the first mask material film;
    forming a second mask material film having a desired film thickness on the first mask material film so as to cover the resist pattern;
    carrying out etchback on the second mask material film so as to form sidewall spacers on sidewalls of the resist pattern and to expose the resist pattern and a portion of the first mask material film;
    simultaneously processing the resist pattern and the first mask material film to form a mask pattern including the sidewall spacers and portions of the first mask material film covered by the sidewall spacers; and
    processing the workpiece film using the mask pattern as a mask,
    wherein the first mask material film is a carbon film including carbon as a main component.

2. The method of manufacturing a semiconductor device according to claim 1, wherein,
    the forming of the resist pattern on the first mask material film comprises a forming of an inclined surface which is carried out at a location of a part of the end portion of the resist pattern, and
    the resist pattern and the first mask material film are exposed by being eliminated when the etchback of a part of the second mask material film formed on the inclined surface is carried out.

3. A method of manufacturing a semiconductor device, comprising:
    forming a first mask material film on a workpiece film formed on a semiconductor substrate;
    forming a resist pattern on the first mask material film;
    forming a second mask material film having a desired film thickness on the first mask material film so as to cover the resist pattern;
    carrying out etchback of the second mask material film so as to expose the resist pattern and the first mask material film;
    processing the resist pattern and the first mask material film simultaneously which are exposed, while leaving the second mask material film of which etchback is carried out; and
    processing the workpiece film which exposes under the first mask material film,
    wherein the first mask material film comprises a first region formed by CVD (Chemical Vapor Deposition) method at a first temperature condition so as to function as a mask, and a second region formed on the first region by the CVD method at a second temperature condition being changed from the first temperature condition in the same chamber so as to function as an antireflection film.

4. The method of manufacturing a semiconductor device according to claim 3, wherein,
    the first temperature condition is higher than the second temperature condition.

5. The method of manufacturing a semiconductor device according to claim 4, wherein,
    the first mask material film is the carbon film including carbon as a main component.

6. The method of manufacturing a semiconductor device according to claim 5, wherein,
    the workpiece film is processed to a line and space pattern.

7. A method of manufacturing a semiconductor device, comprising:
    forming a first mask material film on a workpiece film formed on a semiconductor substrate;
    forming a first resist pattern directly on the first mask material film;
    forming a second mask material film having a desired film thickness on the first mask material film so as to cover the first resist pattern;
    forming a second resist pattern on the second mask material film;
    carrying out etchback on the second mask material film so as to form sidewall spacers on sidewalls of the first resist pattern and to expose the first resist pattern and a portion of the first mask material film, and simultaneously, transferring the second resist pattern to the second mask material film;
    simultaneously processing the first and second resist patterns and the first mask material film to form a mask pattern including the sidewall spacers and portions of the first mask material film covered by the sidewall spacers; and
    processing the workpiece film using the mask pattern as a mask,
    wherein the first mask material film is a carbon film including carbon as a main component.

8. The method of manufacturing a semiconductor device according to claim 7, wherein,
    the forming of the first resist pattern on the first mask material film comprises a forming of an inclined surface which is carried out at a location of a part of the end portion of the first resist pattern, and the first resist pattern and the first mask material film are exposed by being eliminated when the etchback of a part of the second mask material film formed on the inclined surface is carried out.

9. A method of manufacturing a semiconductor device, comprising:
forming a first mask material film on a workpiece film formed on a semiconductor substrate;
forming a first resist pattern on the first mask material film;
forming a second mask material film having a desired film thickness on the first mask material film so as to cover the first resist pattern;
forming a second resist pattern on the second mask material film;
carrying out etchback of the second mask material film so as to expose the first resist pattern and the first mask material film, and simultaneously, transferring the second resist pattern to the second mask material film;
processing the first and second resist patterns and the first mask material film simultaneously which are exposed, while leaving the second mask material film of which etchback is carried out; and
processing the workpiece film which exposes under the first mask material film,
wherein the first mask material film comprises a first region formed by CVD (Chemical Vapor Deposition) method at a first temperature condition so as to function as a mask, and a second region formed on the first region by the CVD method at a second temperature condition being changed from the first temperature condition in the same chamber so as to function as an antireflection film.

10. The method of manufacturing a semiconductor device according to claim 9, wherein,
the first temperature condition is higher than the second temperature condition.

11. The method of manufacturing a semiconductor device according to claim 10, wherein,
the first mask material film is the carbon film including carbon as a main component.

12. The method of manufacturing a semiconductor device according to claim 11, wherein,
the workpiece film is processed to a line and space pattern.

13. A method of manufacturing a semiconductor device, comprising:
forming a first mask material film on a workpiece film formed on a semiconductor substrate;
forming a first section where a third mask material film does not exist and a second section where the third mask material film exists, on the first mask material film;
forming a resist pattern directly on the first mask material film and the third mask material film;
forming a second mask material film having a desired film thickness on the first mask material film and the third mask material film so as to cover the resist pattern;
carrying out etchback on the second mask material film so as to form sidewall spacers on sidewalls of the resist pattern and to expose the resist pattern and a portion of the first mask material film;
simultaneously processing the resist pattern and the first mask material film to form a mask pattern including the sidewall spacers and portions of the first mask material film covered by the sidewall spacers; and
processing the workpiece film using the mask pattern as a mask
wherein the first mask material film is a carbon film including carbon as a main component.

14. The method of manufacturing a semiconductor device according to claim 13, wherein,
the forming of the resist pattern on the first mask material film comprises a forming of an inclined surface which is carried out at a location of a part of the end portion of the resist pattern, and
the resist pattern and the first mask material film are exposed by being eliminated when the etchback of a part of the second mask material film formed on the inclined surface is carried out.

15. A method of manufacturing a semiconductor device, comprising:
forming a first mask material film on a workpiece film formed on a semiconductor substrate;
forming a first section where a third mask material film does not exist and a second section where the third mask material film exists, on the first mask material film;
forming a resist pattern on the first mask material film and the third mask material film;
forming a second mask material film having a desired film thickness on the first mask material film and the third mask material film so as to cover the resist pattern;
carrying out etchback of the second mask material film so as to expose the resist pattern and the first mask material film;
processing the resist pattern and the first mask material film simultaneously which are exposed, while leaving the second mask material film of which etchback is carried out; and
processing the workpiece film which exposes under the first mask material film,
wherein the first mask material film comprises a first region formed by CVD (Chemical Vapor Deposition) method at a first temperature condition so as to function as a mask, and a second region formed on the first region by the CVD method at a second temperature condition being changed from the first temperature condition in the same chamber so as to function as an antireflection film.

16. The method of manufacturing a semiconductor device according to claim 15, wherein,
the first temperature condition is higher than the second temperature condition.

17. The method of manufacturing a semiconductor device according to claim 16, wherein,
the first mask material film is the carbon film including carbon as a main component.

* * * * *